United States Patent
Chang et al.

(10) Patent No.: US 10,072,237 B2
(45) Date of Patent: Sep. 11, 2018

(54) PHOTORESIST CLEANING COMPOSITION USED IN PHOTOLITHOGRAPHY AND A METHOD FOR TREATING SUBSTRATE THEREWITH

(71) Applicant: Air Products and Chemicals, Inc., Allentown, PA (US)

(72) Inventors: Randy Li-Kai Chang, Pingzhen (TW); Gene Everad Parris, Coopersburg, PA (US); Hsiu Mei Chen, Taoyuan (TW); Yi-Chia Lee, Chupei (TW); Wen Dar Liu, Chupei (TW); Tianniu Chen, Westford, MA (US); Laura M. Matz, Allentown, PA (US); Ryback Li Chang Lo, Chupei (TW); Ling-Jen Meng, Taipei (TW)

(73) Assignee: VERSUM MATERIALS US, LLC, Tempe, AZ (US)

( * ) Notice: Subject to any disclaimer, the term of this patent is extended or adjusted under 35 U.S.C. 154(b) by 0 days.

(21) Appl. No.: 15/227,450

(22) Filed: Aug. 3, 2016

(65) Prior Publication Data
US 2017/0037344 A1 Feb. 9, 2017

Related U.S. Application Data

(60) Provisional application No. 62/201,352, filed on Aug. 5, 2015.

(51) Int. Cl.

| | | |
|---|---|---|
| *C11D 11/00* | (2006.01) | |
| *H01L 23/00* | (2006.01) | |
| *C11D 7/26* | (2006.01) | |
| *C11D 7/34* | (2006.01) | |
| *C11D 7/50* | (2006.01) | |
| *C11D 7/32* | (2006.01) | |
| *C11D 3/00* | (2006.01) | |
| *G03F 7/42* | (2006.01) | |
| *H01L 21/311* | (2006.01) | |

(52) U.S. Cl.
CPC ........ *C11D 11/0047* (2013.01); *C11D 3/0073* (2013.01); *C11D 7/265* (2013.01); *C11D 7/3209* (2013.01); *C11D 7/34* (2013.01); *C11D 7/5009* (2013.01); *C11D 7/5013* (2013.01); *C11D 7/5022* (2013.01); *G03F 7/425* (2013.01); *G03F 7/426* (2013.01); *H01L 21/31133* (2013.01); *H01L 24/02* (2013.01); *H01L 24/11* (2013.01); *H01L 24/03* (2013.01); *H01L 24/05* (2013.01); *H01L 24/13* (2013.01); *H01L 24/94* (2013.01); *H01L 2224/02311* (2013.01); *H01L 2224/0345* (2013.01); *H01L 2224/03452* (2013.01); *H01L 2224/03462* (2013.01); *H01L 2224/0401* (2013.01); *H01L 2224/05073* (2013.01); *H01L 2224/05082* (2013.01); *H01L 2224/05147* (2013.01); *H01L 2224/05155* (2013.01); *H01L 2224/05171* (2013.01); *H01L 2224/05614* (2013.01); *H01L 2224/05624* (2013.01); *H01L 2224/05644* (2013.01); *H01L 2224/05647* (2013.01); *H01L 2224/05655* (2013.01); *H01L 2224/05664* (2013.01); *H01L 2224/05666* (2013.01); *H01L 2224/05671* (2013.01); *H01L 2224/05672* (2013.01); *H01L 2224/1147* (2013.01); *H01L 2224/1148* (2013.01); *H01L 2224/1181* (2013.01); *H01L 2224/11462* (2013.01); *H01L 2224/131* (2013.01); *H01L 2224/13082* (2013.01); *H01L 2224/13083* (2013.01); *H01L 2224/13111* (2013.01); *H01L 2224/13124* (2013.01); *H01L 2224/13144* (2013.01); *H01L 2224/13147* (2013.01); *H01L 2224/13155* (2013.01); *H01L 2224/81191* (2013.01); *H01L 2224/94* (2013.01)

(58) Field of Classification Search
CPC ......... H01L 21/31133; H01L 21/02052; H01L 21/02057; H01L 21/31111; H01L 2224/18144; H01L 2224/13147; H01L 2224/13155; H01L 24/13; H01L 24/11; G03F 7/425; G03F 7/426; G03F 7/422; G03F 7/42; C11D 7/3218; C11D 7/5009; C11D 7/5022; C11D 7/34; C11D 7/265; C11D 7/3209
See application file for complete search history.

(56) References Cited

U.S. PATENT DOCUMENTS

| | | | |
|---|---|---|---|
| 5,407,788 A | 4/1995 | Fang | |
| 5,877,078 A * | 3/1999 | Yanagida | ............... H01L 24/03 257/E21.508 |
| 5,965,328 A | 10/1999 | Sano et al. | |
| 6,040,117 A | 3/2000 | Ota et al. | |
| 6,319,835 B1 | 11/2001 | Sahbari et al. | |
| 6,692,818 B2 * | 2/2004 | Hirano | ................. H05K 1/0373 174/258 |
| 7,632,796 B2 | 12/2009 | Phenis et al. | |
| 7,655,608 B2 | 2/2010 | Pollard et al. | |
| 7,851,427 B2 | 12/2010 | Pollard et al. | |
| 8,263,539 B2 | 9/2012 | Phenis et al. | |
| 8,440,389 B2 | 5/2013 | Pollard et al. | |
| 8,440,599 B2 | 5/2013 | Egbe et al. | |
| 8,551,682 B2 | 10/2013 | Atkinson et al. | |
| 8,685,910 B2 | 4/2014 | Yokoi et al. | |

(Continued)

FOREIGN PATENT DOCUMENTS

| | | |
|---|---|---|
| JP | 7028254 A2 | 1/1995 |
| JP | 8301911 | 11/1996 |

(Continued)

*Primary Examiner* — Caridad Everhart
(74) *Attorney, Agent, or Firm* — Anne B. Kiernan

(57) ABSTRACT

It is disclosed a photoresist cleaning composition for stripping a photoresist pattern having a film thickness of 3-150 µm, which contains (a) quaternary ammonium hydroxide (b) a mixture of water-soluble organic solvents (c) at least one corrosion inhibitor and (d) water, and a method for treating a substrate therewith.

20 Claims, No Drawings

(56) References Cited

U.S. PATENT DOCUMENTS

| | | |
|---|---|---|
| 9,091,914 B2 | 7/2015 | Hatakeyama |
| 9,164,383 B2 | 10/2015 | Hatakeyama |
| 2003/0096199 A1* | 5/2003 | Nakagawa ............... G03F 7/30 430/325 |
| 2004/0147420 A1* | 7/2004 | Zhou ................... C11D 7/3254 510/176 |
| 2006/0016785 A1 | 1/2006 | Egbe et al. |
| 2006/0172905 A1* | 8/2006 | Rovito .................... C11D 7/08 510/175 |
| 2008/0280452 A1* | 11/2008 | Yokoi .................... G03F 7/425 438/754 |
| 2009/0011967 A1 | 1/2009 | Lee et al. |
| 2009/0036344 A1 | 2/2009 | Pollard et al. |
| 2009/0047609 A1 | 2/2009 | Atkinson et al. |
| 2009/0203566 A1* | 8/2009 | Lee ........................ G03F 7/425 510/175 |
| 2010/0062609 A1* | 3/2010 | Sharma ............ H01L 21/02057 438/745 |
| 2010/0137181 A1 | 6/2010 | Pollard et al. |
| 2010/0221503 A1 | 9/2010 | Pollard et al. |
| 2012/0040529 A1* | 2/2012 | Klipp ..................... G03F 7/425 438/675 |
| 2013/0161840 A1 | 6/2013 | Pollard et al. |
| 2013/0334679 A1 | 12/2013 | Atkinson et al. |
| 2014/0142017 A1 | 5/2014 | Peters et al. |
| 2014/0155310 A1* | 6/2014 | Phenis ................ C11D 7/3218 510/176 |
| 2015/0175943 A1 | 6/2015 | Casteel, Jr. et al. |
| 2016/0152930 A1 | 6/2016 | Egbe et al. |
| 2016/0186058 A1 | 6/2016 | Parris et al. |
| 2016/0186106 A1* | 6/2016 | Du ...................... C11D 11/0047 510/176 |
| 2016/0254164 A1* | 9/2016 | Sugishima ........ H01L 21/31133 |

FOREIGN PATENT DOCUMENTS

| | | |
|---|---|---|
| JP | 10239865 | 9/1998 |
| JP | 2001324823 | 11/2001 |
| WO | 2011142600 A2 | 11/2011 |
| WO | 2016109387 A1 | 7/2016 |

* cited by examiner

PHOTORESIST CLEANING COMPOSITION USED IN PHOTOLITHOGRAPHY AND A METHOD FOR TREATING SUBSTRATE THEREWITH

CROSS REFERENCE TO RELATED PATENT APPLICATIONS

The present patent application claims the benefit of U.S. Provisional Patent Application Ser. No. 62/201,352 filed 5 Aug. 2015, which is totally incorporated by reference.

BACKGROUND OF THE INVENTION

The present invention relates to a photoresist cleaning composition used in photolithography for stripping a thick photoresist pattern, and a method for treating a substrate therewith. The photoresist cleaning composition of the invention is suitably applied especially for the formation of a bump or pillar or redistribution layer (RDL) in the production of a semiconductor device, such as IC and LSI. It may also be used after an etch process, such as a Bosch etch process, in the formation of Through Silicon Vias (TSVs) on a silicon or glass substrate in the production of a semiconductor device, such as IC and LSI.

In recent years, with the high integration of semiconductor devices such as IC and LSI and downsizing of chip size, it has been required to reduce the size of the metallic wirings and to align bumps or pillars as connection terminals (minute salient electrodes) having a height of 20 µm or more on a substrate with high precision. In the future, with further downsizing of chip size, high precision of metallic wirings and bumps will become even more necessary.

The bump formation is carried out by, for example, providing a metallic thin film on a substrate, forming a thick photoresist pattern on the metallic thin film by photolithography technique, providing a conductive layer on the photoresist pattern-uncovered area (i.e., a metallic thin film-exposed area) of the substrate to form bumps, pillars or RDLs and then removing the photoresist pattern.

The photoresist pattern may be a thick film, usually in a film thickness of about 3-150 µm, and the photoresist may be a positive-working photoresist material since many common stripping chemicals for negative-working photoresists can severely etch or damage substrate materials such as copper, nickel, alloys of copper or nickel with various metals, Tin-Silver alloys (also known as SAC of varying compositions), TiN or other passivation materials such as SiN, polyimide, BCB, etc.

Since the photoresist pattern may be thick, usually in a film thickness of about 3-150 µm, the photoresist may be a negative-working photoresist materials in view of resistance to plating, pattern shape property, etc. It is typically more difficult to remove photoresist patterns made of the negative-working photoresist materials as compared to those made of positive-working photoresist materials, and therefore, it is even more difficult to remove thick photoresist patterns made of the negative-working photoresist materials relative to thick positive-working photoresist materials.

Further, the thick photoresist pattern may deform or collapse during the formation process, because of its heavy film thickness. In such a case, it is necessary to discontinue the subsequent process and to carry out a re-work by totally removing the deformed photoresist pattern from the substrate and repeat the steps used to form the photoresist pattern.

The removal of the photoresist pattern after the bump formation or the removal of the photoresist pattern for the re-work, typically takes place in a tank of a photoresist cleaning composition to strip away the photoresist pattern (cured material) rapidly and completely. It is important that the photoresist cleaning composition not corrode the metallic thin film while cleaning the photoresist, but it is important to remove the photoresist completely. In addition, in forming a bump on the substrate, a degenerated film is possibly formed at the interface between the photoresist pattern and the bump. It is therefore necessary to prevent corrosion of the metallic film and to protect the bump from corrosion or any other materials present that are not intended to be removed by the photoresist cleaning composition.

JP-A-08-301911 describes a radiation-sensitive resin composition as a pattern forming material for the use of a bump formation and discloses in paragraph Nos. [0032] and [0043] a mixture of a quaternary ammonium, dimethyl sulfoxide and water (specifically, a dimethyl sulfoxide solution of 0.5 mass % of tetramethylammonium hydroxide (containing 1.5 mass % of water)) as a stripping liquid for stripping a photo-cured pattern. However, this stripping liquid involves problems such that it takes time to dissolve the photo-cured pattern that was stripped away from the substrate in the stripping liquid, and that the throughput is low. Also, this stripping liquid causes high etching of various metal substrates used in these applications.

JP-A-10-239865 describes a formulation containing specific amounts of dimethyl sulfoxide, 1,3-dimethyl-2-imidazolidinone, a tetraalkylammonium hydroxide, and water as a stripping liquid for stripping a negative-working photoresist for forming a bump. As is the case of JP-A-08-301911 above, JP-A-10-239865 also involves problems such that it takes a time to dissolve the photo-cured pattern that was stripped away from the substrate in the stripping liquid, and that the throughput is low. Also importantly, this stripping liquid causes high etching of various metal substrates used in these applications. Further, the stripping solution in JP-A-10-239865 contains 1,3-dimethyl-2-imidazolidinone as an essential component. This compound causes discoloration or corrosion of Cu.

In the photolithographic field, JP-A-2001-324823, JP-A-07-028254, etc., disclose stripping liquids containing a quaternary ammonium hydroxide and a water-soluble organic solvent such as dimethyl sulfoxide. However, none of those describe at all the removability of the difficult to remove thick positive or negative-working photoresists that are suitably used for forming a thick pattern for the formation of a bump.

Other known compositions may strip away the photoresist, but also corrode the metals and other materials present on the substrates to be cleaned. A composition is needed that cleans well and results in little or no corrosion of the metal and/or passivation materials on the substrate.

BRIEF SUMMARY OF THE INVENTION

The object of the invention is to provide a photoresist cleaning composition capable of not only stripping a thick photoresist pattern (that may be used for bump formation) from a substrate, and a method for treating a substrate using the photoresist cleaning composition.

In one aspect of the invention is provided a photoresist cleaning composition for stripping a photoresist pattern having a film thickness of 3-150 µm, which comprises (a) 0.5-5 or 0.5-4 or 0.5-3 or 1-5 or 1-4 or 1-3 or 1-2 or 1.5-3 or 1.8-2.3 or 1.25-4.5 mass % of at least one quaternary ammonium hydroxide or mixtures of two or more quaternary ammonium hydroxides; (b) 60-97.5 or 60-96 or 73-98 or 75-96 or 90-96 or 89-95 or 78-85 or 64-69 or 80.5-82.5 or 82-97.5 or 80-83 or 85-96 or 89-94 or 85-97.5 or 86-97 or 91-96 mass % of a mixture of water-soluble organic solvent comprising dimethylsulfoxide (DMSO), sulfolane or dimethylsulfone or mixtures thereof and at least one additional organic solvent or two or more additional organic solvents; (c) 0.5-15 or 0.5-14 or 0.5-12 or 0.5-10 or 10.5-15 or 11-14 or 11-13 or 10-20 or 0.5-5 or 0.5-4 or 0.5-3 or 1-10 or 1-5 or 1-4 or 1-3 or 3-4 mass % of at least one corrosion inhibitor or mixtures of two or more corrosion inhibitors; and (d) 0.5-25 or 0.5-10 or 1-10 or 1-8 or 1-7 or 2-5 or 1-5 or 1-2 or 3-7 or 4-6 mass % of water.

Note anywhere "comprising", "containing", "having" or the like is stated herein, it includes "consisting essentially of" and "consisting of".

The present invention provides, in another aspect of the invention, a photoresist cleaning composition for stripping a photoresist pattern having a film thickness of 3-150 μm, which comprises (a) 0.5-5 or 0.5-4 or 0.5-3 or 1-5 or 1-4 or 1-3 or 1-2 or 1.5-3 or 1.8-2.3 or 1.25-4.5 mass % of at least one quaternary ammonium hydroxide, such as tetramethylammonium hydroxide and/or tetraethylammonium hydroxide or any of the other quaternary ammonium hydroxide(s) (that may be selected from those listed below), or mixtures thereof, (b) 60-97.5 or 60-96 or 73-98 or 75-96 or 90-96 or 89-95 or 78-85 or 64-69 or 80.5-82.5 or 82-97.5 or 80-83 or 85-96 or 89-94 or 85-97.5 or 86-97 or 91-96 mass % of a mixture of water-soluble organic solvent comprising dimethylsulfoxide (DMSO), sulfolane or dimethylsulfone or mixtures thereof and at least one (or two or more) additional organic solvent(s) selected from the group consisting of propylene glycol, other glycols, diols, triols, cyclic alcohols, tetrahydrofurfuryl alcohol, dipropyleneglycol methylether, other glycol ethers, gamma-butyrolactone, gamma-valerolactone, dimethylacetamide, monoethanolamine, or other alkanolamines (typically $C_1$-$C_6$ alkanolamines, such as diethanolethylamine), aminopropylmorpholine, and mixtures thereof; (c) 0.5-15 or 0.5-14 or 0.5-12 or 0.5-10 or 10.5-15 or 11-14 or 11-13 or 10-20 or 0.5-5 or 0.5-4 or 0.5-3 or 1-10 or 1-5 or 1-4 or 1-3 or 3-4 mass % of at least one corrosion inhibitor selected from the group consisting of catechol, tert-butyl catechol, ammonium benzoate, anthranilic acid, benzoic acid, salicylic acid, citric acid, gallic acid, mono or dihydroxybenzoic acid, polyethyleneimine (PEI), diethylhydroxylamine (DEHA), hydroxylamine or dipropylhydroxylamine or salts thereof or mixtures of any of the corrosion inhibitors; and (d) 0.5-25 or 0.5-10 or 1-10 or 1-7 or 2-5 or 1-5 or 1-2 or 3-7 or 4-6 mass % of water.

In another aspect of the invention is provided a photoresist cleaning composition for stripping a photoresist pattern having a film thickness of 3-150 μm, which comprises (a) 0.5-5 or 0.5-4 or 0.5-3 or 1-5 or 1-4 or 1-3 or 1-2 or 1.5-3 or 1.8-2.3 or 1.25-4.5 mass % of at least one quaternary ammonium hydroxide selected from the group consisting of tetramethylammonium hydroxide or tetraethylammonium hydroxide, and mixtures thereof; (b) 60-97.5 or 60-96 or 73-98 or 75-96 or 90-96 or 89-95 or 78-85 or 64-69 or 80.5-82.5 or 82-97.5 or 80-83 or 85-96 or 89-94 or 85-97.5 or 86-97 or 91-96 mass % of a mixture of water-soluble organic solvent comprising dimethylsulfoxide (DMSO), sulfolane or dimethylsulfone or mixtures thereof and at least one additional organic solvent selected from the group consisting of propylene glycol, tetrahydrofurfuryl alcohol, dipropyleneglycol methylether, other glycol ethers, gamma-butyrolactone, gamma-valerolactone, dimethylacetamide, monoethanolamine or aminopropylmorpholine and mixtures thereof; (c) 0.5-15 or 0.5-14 or 0.5-12 or 0.5-10 or 10.5-15 or 11-14 or 11-13 or 10-20 or 0.5-5 or 0.5-4 or 0.5-3 or 1-10 or 1-5 or 1-4 or 1-3 or 3-4 mass % of at least one corrosion inhibitor selected from the group consisting of catechol, tert-butyl catechol, ammonium benzoate, anthranilic acid, benzoic acid, salicylic acid, citric acid, gallic acid, mono or dihydroxybenzoic acid, polyethyleneimine (PEI) or mixtures thereof and/or diethylhydroxylamine (DEHA), hydroxylamine or dipropylhydroxylamine or salts thereof or mixtures thereof; and (d) 0.5-25 or 0.5-10 or 1-10 or 1-8 or 1-7 or 2-5 or 1-5 or 1-2 or 3-7 or 4-6 mass % of water.

In another aspect of the invention is provided a photoresist cleaning composition for stripping a photoresist pattern having a film thickness of 3-150 μm, which comprises (a) 0.5-5 or 0.5-4 or 0.5-3 or 1-5 or 1-4 or 1-3 or 1-2 or 1.5-3 or 1.8-2.3 or 1.25-4.5 mass % of one or more quaternary ammonium hydroxides, (b) 60-97.5 or 60-96 or 73-98 or 75-96 or 90-96 or 89-95 or 78-85 or 64-69 or 80.5-82.5 or 82-97.5 or 80-83 or 85-96 or 89-94 or 85-97.5 or 86-97 or 91-96 mass % of a dimethylsulfoxide (DMSO), sulfolane or dimethylsulfone or mixtures thereof and at least one additional organic solvent selected from the group consisting of propylene glycol, tetrahydrofurfuryl alcohol, dipropyleneglycol methylether, other glycol ethers, gamma-butyrolactone, gamma-valerolactone, dimethylacetamide, monoethanolamine, diethanolamine, aminopropylmorpholine or other solvents or mixtures thereof; (c) 0.5-15 or 0.5-14 or 0.5-12 or 0.5-10 or 10-20 or 10.5-15 or 11-14 or 11-13 or 0.5-5 or 0.5-4 or 0.5-3 or 1-10 or 1-5 or 1-4 or 1-3 or 3-4 mass % of diethylhydroxylamine (DEHA), hydroxylamine or dipropylhydroxylamine or salts thereof or mixtures thereof and at least one additional corrosion inhibitor selected from the group consisting of catechol, tert-butyl catechol, ammonium benzoate, anthranilic acid, benzoic acid, salicylic acid, citric acid, gallic acid, mono or dihydroxybenzoic acid, polyethyleneimine (PEI) or mixtures thereof; and (d) 0.5-25 or 0.5-10 or 1-10 or 1-8 or 1-7 or 2-5 or 1-5 or 1-2 or 3-7 or 4-6 mass % of water.

In another aspect of the invention, is provided a photoresist cleaning composition for stripping a photoresist pattern having a film thickness of 3-150 μm, which comprises (a) 0.5-5 or 1-5 or 1.25-4.5 mass % of at least one quaternary ammonium hydroxide or mixtures of two or more quaternary ammonium hydroxides; (b) 82-97.5 or 85-96 or 89-94 mass % of a mixture of water-soluble organic solvent comprising dimethylsulfoxide (DMSO), sulfolane or dimethylsulfone or mixtures thereof and at least one additional organic solvent or two or more additional organic solvents; (c) 1-5 or 1-4 or 1-3 mass % of at least one corrosion inhibitor or mixtures of two or more corrosion inhibitors; and (d) 1-10 or 1-8 or 1-7 mass % of water.

In another aspect of the invention is provided a photoresist cleaning composition for stripping a photoresist pattern having a film thickness of 3-150 μm, which comprises (a) 0.5-5 or 1-5 or 1.25-4.5 mass % of at least one quaternary ammonium hydroxide or mixtures of two or more quaternary ammonium hydroxides; (b) mixture of water-soluble organic solvent comprising 80-96 or 83-94 or 87-92 mass % dimethylsulfoxide (DMSO), sulfolane or dimethylsulfone or mixtures thereof and 1-4 or 2-3 or 2 mass % of at least one additional organic solvent or two or more additional organic solvents; (c) 1-5 or 1-4 or 1-3 mass % of at least one corrosion inhibitor or mixtures of two or more corrosion inhibitors; and (d) 1-10 or 1-8 or 1-7 mass % of water.

In another aspect of the invention is provided a photoresist cleaning composition for stripping a photoresist pattern having a film thickness of 3-150 μm, which comprises (a) 0.5-5 or 1-5 or 1.25-4.5 mass % of at least one quaternary ammonium hydroxide or mixtures of two or more quaternary ammonium hydroxides; (b) 82-97.5 or 85-96 or 89-94 mass % of a mixture of water-soluble organic solvent comprising dimethylsulfoxide (DMSO), sulfolane or dimethylsulfone or mixtures thereof and at least one additional organic solvent or two or more additional organic solvents; (c) 1-5 or 1-4 or 1-3 mass % of a mixture of two or more corrosion inhibitors comprising PEI; and (d) 1-10 or 1-8 or 1-7 mass % of water. In the photoresist cleaning composition said PEI may be present from 1-2 or 1 mass %.

In another aspect of the invention is provided a photoresist cleaning composition for stripping a photoresist pattern having a film thickness of 3-150 μm, which comprises (a) 0.5-5 or 1-5 or 1.25-4.5 mass % of at least one quaternary ammonium hydroxide or mixtures of two or more quaternary ammonium hydroxides; (b) mixture of water-soluble organic solvent comprising 80-96 or 83-94 or 87-92 mass % dimethylsulfoxide (DMSO), sulfolane or dimethylsulfone or mixtures thereof and 1-4 or 2-3 or 2 mass % of at least one additional organic solvent or two or more additional organic solvents; (c) 1-5 or 1-4 or 1-3 mass % of at least one corrosion inhibitor or mixtures of two or more corrosion inhibitors comprising PEI; and (d) 1-10 or 1-8 or 1-7 mass % of water. In the photoresist cleaning composition said PEI may be present from 1-2 or 1 mass %.

In another aspect of the invention is provided a photoresist cleaning composition for stripping a photoresist pattern having a film thickness of 3-150 μm, which comprises (a) 0.5-5 or 1-5 or 1-2 mass % of at least one quaternary ammonium hydroxide or mixtures of two or more quaternary ammonium hydroxides; (b) 85-97.5 or 86-97 or 91-96 mass % of a mixture of water-soluble organic solvent comprising dimethylsulfoxide (DMSO), sulfolane or dimethylsulfone or mixtures thereof and at least one additional organic solvent or two or more additional organic solvents; (c) 1-10 or 1-5 or 3-4 mass % of at least one corrosion inhibitor or mixtures of two or more corrosion inhibitors; and (d) 1-10 or 1-5 or 1-2 mass % of water.

In another aspect of the invention is provided a photoresist cleaning composition for stripping a photoresist pattern having a film thickness of 3-150 μm, which comprises (a) 0.5-5 or 1-5 or 1-2 mass % of at least one quaternary ammonium hydroxide or mixtures of two or more quaternary ammonium hydroxides; (b) mixture of water-soluble organic solvent comprising 35-50 or 38-45 or 41-44 mass % dimethylsulfoxide (DMSO), sulfolane or dimethylsulfone or mixtures thereof and 45-58 or 48-54 or 50-52 mass % of additional organic solvent or two or more additional organic solvents; (c) 1-10 or 1-5 or 3-4 mass % of at least one corrosion inhibitor or mixtures of two or more corrosion inhibitors; and (d) 1-10 or 1-5 or 1-2 mass % of water.

In another aspect of the invention is provided a photoresist cleaning composition for stripping a photoresist pattern having a film thickness of 3-150 μm, which comprises (a) 1-5 or 1.5-3 or 1.8-2.3 mass % of at least one quaternary ammonium hydroxide or mixtures of two or more quaternary ammonium hydroxides; (b) 78-85 or 80-83 or 80.5-82.5 mass % of a mixture of water-soluble organic solvent comprising dimethylsulfoxide (DMSO), sulfolane or dimethylsulfone or mixtures thereof and at least one additional organic solvent or two or more additional organic solvents; (c) 10.5-15 or 11-14 or 11-13 mass % of at least one corrosion inhibitor or mixtures of two or more corrosion inhibitors; and (d) 1-10 or 3-7 or 4-6 mass % of water. The photoresist cleaning composition may comprise an amine or an alkanolamine as an additional organic solvent.

In another aspect of the invention is provided a photoresist cleaning composition for stripping a photoresist pattern having a film thickness of 3-150 μm, which comprises (a) 1-5 or 1.5-3 or 1.8-2.3 mass % of at least one quaternary ammonium hydroxide or mixtures of two or more quaternary ammonium hydroxides; (b) 59-84 or 65-81 or 63-67 mass % dimethylsulfoxide (DMSO), sulfolane or dimethylsulfone or mixtures thereof and 1-20 or 1-15 or 2-15 mass % of at least one additional organic solvent or two or more additional organic solvents; (c) 10.5-15 or 11-14 or 11-13 mass % of at least one corrosion inhibitor or mixtures of two or more corrosion inhibitors; and (d) 1-10 or 3-7 or 4-6 mass % of water. In any of the aspects, the photoresist cleaning composition may comprise an amine or an alkanolamine as an additional organic solvent.

In another aspect of the invention is provided a photoresist cleaning composition for stripping a photoresist pattern having a film thickness of 3-150 μm, which comprises (a) 1-5 or 1.5-3 or 1.8-2.3 mass % of at least one quaternary ammonium hydroxide or mixtures of two or more quaternary ammonium hydroxides; (b) 78-85 or 80-83 or 80.5-82.5 mass % of a mixture of water-soluble organic solvent comprising dimethylsulfoxide (DMSO), sulfolane or dimethylsulfone or mixtures thereof and at least one additional organic solvent or two or more additional organic solvents; (c) 10-20 or 5-14.5 or 7-12 or 9-11 mass % of diethylhydroxylamine (DEHA), hydroxylamine or dipropylhydroxylamine or salts thereof or mixtures thereof and 0.5-5 or 1-4 or 1-3 mass % of at least one additional corrosion inhibitor or mixtures of two or more additional corrosion inhibitors; and (d) 1-10 or 3-7 or 4-6 mass % of water. The photoresist cleaning composition may comprise an amine or an alkanolamine as an additional organic solvent.

In another aspect of the invention is provided a photoresist cleaning composition for stripping a photoresist pattern having a film thickness of 3-150 μm, which comprises (a) 1-5 or 1.5-3 or 1.8-2.3 mass % of at least one quaternary ammonium hydroxide or mixtures of two or more quaternary ammonium hydroxides; (b) 59-84 or 65-81 or 63-67 mass % dimethylsulfoxide (DMSO), sulfolane or dimethylsulfone or mixtures thereof and 1-20 or 1-15 or 2-15 mass % of at least one additional organic solvent or two or more additional organic solvents; (c) 10-20 or 5-14.5 or 7-12 or 9-11 mass % of diethylhydroxylamine (DEHA), hydroxylamine or dipropylhydroxylamine or salts thereof or mixtures thereof and 0.5-5 or 1-4 or 1-3 mass % of at least one additional corrosion inhibitor or mixtures of two or more additional corrosion inhibitors and (d) 1-10 or 3-7 or 4-6 mass % of water. The photoresist cleaning composition may comprise an amine or an alkanolamine as an additional organic solvent.

In another aspect of the invention is provided a photoresist cleaning composition for stripping a photoresist pattern having a film thickness of 3-150 μm, which comprises (a) 1-5 or 1.5-3 or 1.8-2.3 mass % of at least one quaternary ammonium hydroxide or mixtures of two or more quaternary ammonium hydroxides; (b) 64-69 mass % of a mixture of water-soluble organic solvent comprising dimethylsulfoxide (DMSO), sulfolane or dimethylsulfone or mixtures thereof and at least one additional organic solvent or two or more additional organic solvents comprising alkanolamine, typically a $C_1$-$C_6$ alkanolamine, for example monoethanolamine; (c) 10.5-15 or 11-14 or 11-13 mass % of at least one corrosion inhibitor or mixtures of two or more corrosion inhibitors; (d) 1-10 or 3-7 or 4-6 mass % of water.

In any of the aspects of this invention, alone or with other aspects, the water soluble organic solvent may comprise dimethylsulfoxide and at least one additional organic solvent selected from the group consisting of propylene glycol, tetrahydrofurfuryl alcohol, dipropyleneglycol methylether, other glycol ethers, gamma-butyrolactone, gamma-valerolactone, dimethylacetamide, monoethanolamine and aminopropylmorpholine and mixtures thereof. In any aspect of the invention, alone or with other aspects, the photoresist cleaning composition may comprise quaternary ammonium hydroxide selected from the group consisting of tetramethylammonium hydroxide or tetraethylammonium hydroxide, and mixtures thereof.

In another aspect of the invention is provided a photoresist cleaning composition for stripping a photoresist pattern having a film thickness of 3-150 µm, which comprises (a) 1-3 mass % of a quaternary ammonium hydroxide, such as tetramethylammonium hydroxide or tetraethylammonium hydroxide, (b) 90-95 mass % of a dimethylsulfoxide and 1-6 mass % of at least one additional organic solvent selected from the group consisting of propylene glycol, tetrahydrofurfuryl alcohol, dipropyleneglycol methylether, other glycol ethers, gamma-butyrolactone, gamma-valerolactone, dimethylacetamide, monoethanolamine and aminopropylmorpholine and mixtures thereof; (c) 0.5-3 mass % of at least one corrosion inhibitor selected from the group consisting of catechol, tert-butyl catechol, ammonium benzoate, anthranilic acid, benzoic acid, salicylic acid, citric acid, gallic acid, mono or dihydroxybenzoic acid, polyethyleneimine (PEI) or mixtures thereof; and (d) 2-5 mass % of water.

In any of the aspects of the invention, alone or with other aspects, the additional organic solvent(s) is selected from the group consisting of propylene glycol, other glycols, diols, triols, cyclic alcohols, tetrahydrofurfuryl alcohol, dipropyleneglycol methylether, other glycol ethers, gamma-butyrolactone, gamma-valerolactone, dimethylacetamide, monoethanolamine, or other alkyl alkanolamines (such as diethanolethylamine, aminopropylmorpholine, and mixtures thereof. In any aspect of the invention, the at least one corrosion inhibitor selected from the group consisting of catechol, tert-butyl catechol, ammonium benzoate, anthranilic acid, benzoic acid, salicylic acid, citric acid, gallic acid, mono or dihydroxybenzoic acid, polyethyleneimine (PEI), diethylhydroxylamine (DEHA), hydroxylamine or dipropylhydroxylamine or salts thereof or mixtures thereof or mixtures of any of the corrosion inhibitors.

In any aspect of the invention, the corrosion inhibitor, alone or in combination with other aspects of the invention, may comprises PEI that may be present from 1-2 or 1 mass %. In any aspect, the component (b), alone or in combination with other aspects of the invention, may comprise propylene glycol and/or dimethylsulfoxide. In other aspects, alone or in combination with other aspects of the invention, the component (b) may comprise glycol or dipropyleneglycolmethylether.

In one aspect of the photoresist cleaning composition, component (c), alone or in combination with other aspects of the invention, is selected from the group consisting of catechol, tert-butyl catechol, ammonium benzoate, anthranilic acid, benzoic acid, salicylic acid, citric acid, gallic acid, mono or dihydroxybenzoic acid, polyethyleneimine (PEI) or mixtures thereof; or wherein component (c), alone or in combination with other aspects of the invention, is selected from the group consisting of catechol, tert-butyl catechol, gallic acid, mono- or di-hydroxybenzoic acid, or mixtures thereof; or wherein component (c), alone or in combination with other aspects of the invention, is selected from the group consisting of catechol, tert-butyl catechol, mono- or di-hydroxybenzoic acid, or mixtures thereof; or wherein component (c), alone or in combination with other aspects of the invention, is selected from the group consisting of catechol, tert-butyl catechol or mixtures thereof; or wherein component (c), alone or in combination with other aspects of the invention, is selected from the group consisting of citric acid, polyethyleneimine (PEI) or mixtures thereof. The photoresist cleaning composition according to any of the preceding embodiments, alone or in combination with other aspects of the invention, wherein the photoresist pattern may be a photo-cured pattern formed using a positive or negative-working photoresist composition that is polymerized upon irradiation with radiation.

In other aspects of the invention, the corrosion inhibitor, alone or in combination with other aspects of the invention, comprises or further comprises DEHA, or wherein the corrosion inhibitor comprises or further comprises PEI. In other aspects of the invention, alone or in combination with other aspects of the invention, wherein the additional organic solvent comprises or further comprises propylene glycol, or further comprises alkanolamine, such as monoethanolamine.

In other aspects of the invention, the photoresist cleaning composition of any embodiment and/or used in any method, alone or with other aspects, may be free from amides, or free from lactams, or free from imidazolidinones, or free from sulfones, or free from ethers, or free from alkanolamines, or free from hydroxylamines, or free from acids. In another aspect, any composition of this invention used in any method of the invention, alone or with other aspects, may have a pH of 9, or greater than 9.5, or 9.5-12.5, or 9.5-13, or 10-12, or 10.5-11.5, or 11-12.5.

Also, in an additional aspect, the present invention provides a method for treating a substrate, comprising forming a photoresist pattern having a film thickness of 3-150 µm on a substrate having a metallic thin film thereon, providing a conductive layer on a metallic thin film-exposed area or a photoresist pattern uncovered area, and bringing the photoresist pattern into contact with the photoresist cleaning composition to strip the photoresist pattern using any of the photoresist cleaning compositions disclosed herein.

In other aspects of the invention, the present invention provides a method for treating a substrate, comprising the steps of: forming a photoresist pattern having a film thickness of 3-150 µm on a substrate having a metallic thin film thereon, providing a non-conductive passivation layer on the metallic thin film-exposed area or a photoresist pattern uncovered area, bringing the photoresist pattern into contact with any of the photoresist cleaning compositions disclosed herein to strip the photoresist pattern.

In other aspects of the invention, a method for treating a substrate is provided comprising forming a photoresist pattern having a film thickness of 3-150 µm on a substrate having a metallic thin film thereon, providing a conductive layer on a metallic thin film-exposed area or a photoresist pattern uncovered area, and bringing the photoresist pattern into contact with any of the photoresist cleaning compositions disclosed herein to strip and dissolve the photoresist pattern.

In other aspects of the method, the photoresist pattern is a photo-cured pattern formed using a positive- or negative-working photoresist composition that is polymerized upon irradiation with radiation.

In other aspects of the invention is provided a method for treating a substrate, comprising forming a photoresist pattern having a film thickness of 3-150 μm on a substrate having a metallic thin film thereon, bringing the photoresist pattern into contact with any of the photoresist cleaning compositions described herein to strip and dissolve the photoresist pattern, without providing a conductive layer on a metallic thin film-exposed area or a photoresist pattern uncovered area.

In other aspects of the invention is provided, alone or with other aspects, the method for treating a substrate of this invention, wherein the photoresist pattern may be a photo-cured pattern formed using a positive or negative-working photoresist composition that is polymerized upon irradiation with radiation.

The cleaning compositions and methods of this invention provide one or more of the following benefits: improved strippability and solubility of the components of the photoresist cleaning composition therein and solubility of the photoresist in the photoresist cleaning composition, and low corrosion rates for Cu and other metals and low corrosion of the passivation materials or other materials present on the substrate.

DETAILED DESCRIPTION OF THE INVENTION

The photoresist cleaning composition of the invention is used for stripping a photoresist pattern having a film thickness of 3-150 μm, that is formed on a substrate having a metallic thin film thereon. Component (a) in the photoresist cleaning composition may be a quaternary ammonium hydroxide selected from the group consisting of tetramethylammonium hydroxide (TMAH) or tetraethylammonium hydroxide (TEAH) or mixtures thereof. In alternative embodiments, the quaternary ammonium hydroxide may be or may include tetraethylammonium hydroxide (TEAH). In another example, the composition may include tetramethylammonium hydroxide (TMAH). In other examples, the composition may include one or more of the following: TEAH, TMAH, dimethyldipropylammonium hydroxide, tetrapropylammonium hydroxide, benzyltrimethylammonium hydroxide, dimethyldiethyl ammonium hydroxide and/or tetrabutylammonium hydroxide. In additional examples, the composition may include TEAH, TMAH, dimethyldipropylammonium hydroxide, tetrapropylammonium hydroxide, tetrabutylammonium hydroxide, or a combination thereof. Additional examples of component (a) include tetrapropylammonium hydroxide, tetrabutylammonium hydroxide, methyltripropylammonium hydroxide, and methyltributylammonium hydroxide. Component (a) may be used singly or in admixture of two or more thereof.

The total amount of the one or more quaternary ammonium compounds as component may be (a) 0.5-5 or 0.5-4 or 0.5-3 or 1-5 or 1-4 or 1-3 or 1-2 or 1.5-3 or 1.8-2.3 or 1.25-4.5 mass % in the photoresist cleaning composition of the invention.

The mixture of water-soluble organic solvents as component (b) may comprise one or more of dimethylsulfoxide (DMSO), sulfolane or dimethylsulfone and at least one organic solvent that is miscible with water. The additional organic solvent may be selected from the group consisting of propylene glycol, tetrahydrofurfuryl alcohol, dipropyleneglycol methylether, other glycol ethers, gamma-butyrolactone, gamma-valerolactone, dimethylacetamide, monoethanolamine and aminopropylmorpholine.

In some embodiments, the photoresist cleaning composition of this invention is free from certain organic solvents or additional organic solvents, which may include any one or more of the following in any combination: amines (other than quaternary ammonium compounds), alkanolamines, amides, morpholines, lactams, imidizoles, imidazolidinones, sulfones, ketones, acids, alcohols, (e.g. monoalcohols, diols, triols), esters, imines and/or ethers. In some embodiments, the composition or the additional organic solvent is not and/or the composition is free from a sulfolane and/or N-methyl-2-pyrrolidone and/or other N-alkyl-pyrrolidines and/or other pyrrolidines. Stated differently, the composition may be "alkanolamine"-free, as one example, or may further comprise additional solvent or solvents that are "alcohol"-free and/or "diol"-free, as other examples. Any of the just-described components may be substituted into the just-listed examples, such as "ketone"-free and "imidazole"-free to describe any of the photoresist compositions of this invention used in any of the methods of this invention.

As component (b) in the invention, a mixed solvent of one or more of dimethylsulfoxide (DMSO), sulfolane or dimethylsulfone and one or more additional organic solvents selected from the group consisting of propylene glycol, tetrahydrofurfuryl alcohol, dipropyleneglycol methylether, other glycol ethers, gamma-butyrolactone, gamma-valerolactone, dimethylacetamide, monoethanolamine or other alkanolamines and aminopropylmorpholine may be used. As component (b) in the invention, a mixed solvent of dimethyl sulfoxide and propylene glycol may be used. A mixed solvent of dimethyl sulfoxide and glycol may be used. Further a mixed solvent of dimethyl sulfoxide and glycol and alkanolamine may be used.

In some embodiments, the mixing ratio of the one or more of dimethylsulfoxide (DMSO), sulfolane or dimethylsulfone to the additional water-soluble organic solvent or organic solvents is preferably greater than 2:1, or greater than 5:1, or greater than 10:1, or greater than 15:1, or greater than 20:1, or greater than 25:1, or greater than 30:1, or greater than 35:1, or greater than 40:1, or greater than 45:1. Component (b) may be used in an admixture of three or more organic solvents. The one or more of dimethylsulfoxide (DMSO), sulfolane or dimethylsulfone or mixtures thereof may be present in the photoresist stripper (photoresist cleaning composition) from 80-96 or 83-94 or 87-92 or 90-95 mass % and the balance of the solvent(s) may be present from 1-4 or 2-3 or 2 or 1-6 mass % of the photoresist stripper composition. In alternative embodiments, the one or more of dimethylsulfoxide (DMSO), sulfolane or dimethylsulfone or mixtures thereof may be present from 58-84 or 65-81 or 63-67 mass % and the balance of the organic solvent(s) may be present from 1-10 or 1-5 or 1.5-3 mass % of the photoresist cleaning composition.

In alternative embodiments, the mass % of the one or more of dimethylsulfoxide (DMSO), sulfolane or dimethylsulfone or mixtures thereof to the mass % of the additional organic solvent(s) may be less than 1:2. In some embodiments the ratio of the mass % of the one or more of dimethylsulfoxide (DMSO), sulfolane or dimethylsulfone or mixtures thereof to the mass % of the additional organic solvent(s) is from about 1:0.9-1.5. In some embodiments, the one or more of dimethylsulfoxide (DMSO), sulfolane or dimethylsulfone or mixtures thereof may be 35-50 or 38-45 or 41-44 mass % and the additional organic solvent(s) may be 45-58 or 48-54 or 50-52 mass % of the photoresist cleaning composition. In alternative embodiments, one or more of dimethylsulfoxide (DMSO), sulfolane or dimethylsulfone may be present in an amount from 34-59 or 35-53 or 40-50 mass % and the additional organic solvent, may be one or more solvents, that are present from 40-65 or 46-60 or 48-55 mass % of the photoresist cleaning composition.

The additional one or more solvents may be selected from the solvents listed above or they may be one or more glycol ethers and/or one or more glycols. If a glycol ether and a glycol are used with the dimethylsulfoxide (DMSO), sulfolane or dimethylsulfone or mixtures thereof in the cleaning composition, the glycol ether may be used in an amount that is greater than 15:1, or greater than 20:1, or approximately 25:1 of the amount of the glycol present.

The total amount of solvent, component (b) may be 60-97.5 or 60-96 or 73-98 or 75-96 or 90-96 or 89-95 or 78-85 or 64-69 or 80.5-82.5 or 82-97.5 or 80-83 or 85-96 or 89-94 or 85-97.5 or 86-97 or 91-96 mass % of the photoresist cleaning composition of the invention.

In some embodiments, the total amount of solvent component (b) may be from 78-85 or 64-69 or 80-83 or 82-97.5 or 80.5-82.5 or 85-96 or 89-94 or 85-97.5 or 86-97 or 91-96 mass % of the photoresist cleaning composition.

The amount of corrosion inhibitor as component (c) may be 0.5-15 or 0.5-14 or 0.5-12 or 0.5-10 or 10.5-15 or 11-14 or 11-13 or 0.5-5 or 0.5-4 or 0.5-3 or 1-10 or 1-5 or 1-4 or 1-3 or 3-4 mass %. The corrosion inhibitor reduces the corrosion of the metallic thin film or passivation materials or dielectric materials. The corrosion inhibitor may be selected from the group consisting of catechol, tert-butyl catechol, ammonium benzoate, anthranilic acid, benzoic acid, salicylic acid, citric acid, gallic acid, mono- or di-hydroxybenzoic acid, polyethyleneimine (PEI) or mixtures thereof. In some embodiments, the preferred corrosion inhibitors are 4-hydroxybenzoic acid (4BHA); or 2,4-dihydroxybenzoic acid; or 3,4-dihydroxybenzoic acid or 3,5-dihydroxybenzoic acid, or citric acid in combination with polyethylene imine (PEI). In alternative embodiments, the photoresist cleaning composition comprises DEHA (as at least one of the corrosion inhibitors) and glycol (as at least one additional organic solvent) and may further comprise amine or alkanolamine.

The corrosion inhibitor in any embodiment may comprise or may additionally further comprise hydroxylamines or acid salts thereof, for example, diethylhydroxylamine (DEHA), hydroxylamine or dipropylhydroxylamine or salts thereof or mixtures thereof, in an amount from 2-20 or 10-20 or 5-14.5 or 5-15 or 7-12 or 8-12 or 9-11 mass % or about 10 mass %. The diethylhydroxylamine (DEHA), hydroxylamine or dipropylhydroxylamine or salts thereof or mixtures thereof may be used alone as the corrosion inhibitor or may be used in addition to one or more additional corrosion inhibitors. The diethylhydroxylamine (DEHA), hydroxylamine or dipropylhydroxylamine or salts thereof or mixtures thereof may be used in the amounts described above for the one or more corrosion inhibitors. In some embodiments comprising diethylhydroxylamine (DEHA), hydroxylamine or dipropylhydroxylamine or salts thereof or mixtures thereof, the photoresist cleaning composition may comprise 60-94 mass % solvent. The solvent may comprise 59-84 or 65-81 or 63-67 mass % of dimethylsulfoxide (DMSO), sulfolane or dimethylsulfone or mixtures thereof and 1-10 or 1-5 or 1-4 mass % may be additional organic solvent(s).

The amount of water as component (d) may be 0.5-25 or 0.5-10 or 1-10 or 1-8 or 1-7 or 2-5 or 1-5 or 1-2 or 3-7 or 4-6 mass % of water in the photoresist cleaning composition of the invention.

The pH of the cleaning composition, when measured using a pH meter at room temperature after diluting the composition to 5 mass % in DIW, should be greater than 9, or greater than 9.5 or 9.5-12.5 or 10-12 or 10.5-11.5 or 11-12.5.

The photoresist cleaning composition may also include one or more of the following optional additives provided that these additives do not adversely affect the stripping and cleaning performance of the composition nor damage the underlying substrate surface: surfactants, chelating agents, chemical modifiers, dyes, biocides, and/or other additives in amounts up to a total of 5% by weight based on the total weight of the composition. Some examples of representative additives include acetylenic alcohols and derivatives thereof, acetylenic diols (non-ionic alkoxylated and/or self-emulsifiable acetylenic diol surfactants) and derivatives thereof, and chelating agents such as beta-diketones, beta-ketoimines, mallic acid and tartaric acid based esters and diesters and derivatives thereof, and tertiary amines, diamines and triamines. In alternative embodiments, the photoresist cleaning compositions of this invention may be free of any of the additives listed in this paragraph individually or collectively. For example, the cleaning composition may be free of surfactants and/or chelating agents and/or chemical modifiers and/or dyes and/or biocides and/or amines and/or acetylenic alcohols, etc.

For the thick photoresist pattern, which is an object to be stripped away and dissolved by the photoresist cleaning composition of the invention in the method of this invention, any photoresist compositions for forming a thick pattern for the formation of a bump can be employed.

Photopolymerization type negative-working photoresist compositions and chemical amplification type negative-working photoresist compositions are currently mainly employed for such photoresist compositions for use in forming thick patterns. The photoresist cleaning composition of the invention should exhibit its advantageous effects to the above currently mainly used photoresist compositions, but is not limited thereto. It is expected that the photoresist cleaning composition of the invention also exhibits its advantageous effects to the positive-working photoresist compositions for i-rays and chemical amplification type positive-working photoresist compositions.

Among the foregoing various photoresist compositions, it is said the photopolymerization type negative-working photoresist compositions, that are polymerized upon irradiation and may become insoluble in alkalis, are the most difficult-to-be-stripped away and difficult-to-be-dissolved in cleaning solutions in photolithography processes. The photoresist cleaning composition of the invention can effectively strip away and in many cases dissolve such photopolymerization type negative-working photoresist compositions.

Examples of the photopolymerization type negative-working photoresist compositions include the ones containing a polymer component (such as (meth)acrylate, cyclic alkyl group-containing (meth)acrylate, and styrene based polymers), a photopolymerization initiator, a solvent, and a crosslinking agent as the main components.

Examples of the chemical amplification type negative-working photoresist compositions include the ones containing a polymer component (such as novolak resins), a cross-linking agent, a photo acid generator, and a solvent as the constitutional components.

An embodiment of the use of the photoresist cleaning composition of the invention and that of the method for treating a substrate using the photoresist cleaning composition will be described below; however, the present invention is not limited thereto. For example a negative-working photoresist coating is described, a positive-working photoresist could be used instead.

A negative-working photoresist coating liquid, which is polymerized upon irradiation and may become insoluble in alkalis, is coated (in a coating step) on a substrate having a metallic thin film thereon by known methods, such as a spin coating method and a roll coating method, and then dried (which may be in a drying step) to make a photoresist layer.

Examples of the metallic thin film include Cu, Cu alloys, Al, Al alloys, Ni, Au, Pd, Tl, V, Cr and alloys or layered structures thereof, including TiCu alloys, TiCuNi alloys, and Cr:Cu or Cu:Ni:Au layered materials. The formation of the metallic thin film (in a forming step) is carried out by, for example, a CVD vapor deposition method, a sputtering method, an electroplating method, etc., but is not limited thereto.

Then, the photoresist layer is irradiated (in an irradiating step) through a mask pattern and is selectively exposed. In the above negative-working photoresist, the light-exposed area is cured by photopolymerization to become a photo-cured area. (For a positive-working photoresist, the areas that are not light exposed are cured.) The type of radiation includes ultraviolet rays, visible rays, far ultraviolet rays, X rays, electron beams, and the like. Sources of radiation include a low-pressure mercury vapor lamp, a high-pressure mercury vapor lamp, a ultrahigh-pressure mercury vapor lamp, KrF, ArF, and $F_2$ excimer laser.

After that, a development is performed (in a developing step), whereby the unexposed area of the photoresist layer is removed to form a photoresist pattern (photo-cured pattern) having a film thickness of 3-150 μm. (For a positive-working photoresist, the areas that are exposed are removed.) The development can be performed by common methods. In the foregoing negative-working photoresist, an alkaline aqueous solution is used as a developing solution. Specific examples thereof include sodium hydroxide, potassium hydroxide, sodium carbonate, sodium silicate, sodium metasilicate, ammonia water, ethylamine, n-propylamine, diethylamine, di-n-propylamine, triethylamine, methyldiethylamine, dimethylethanolamine, triethanolamine, tetramethylammonium hydroxide, tetraethylammonium hydroxide, pyrrole, piperidine, 1,8-diazabicyclo[5.4.0]-7-undecene, and 1,5-diazabicyclo[4.3.0]-5-nonane. The development time is not particularly limited but is usually from about 30 to 360 seconds. Conventional methods can be used for the development, such as an immersion method, a paddle method, and a spray method.

Thereafter, a photoresist-uncovered area (a metallic thin film-exposed area; i.e., an un-irradiated area) on the substrate is filled with a conductive metal to form a conductive layer (a bump formation). For filling the conductive metal, though arbitrary methods can be employed, an electroplating method is mainly used. There are thus formed bumps having a desired height. The bumps usually have a height of 20 μm or more. As the conductive metal for the bump formation, arbitrary metals such as Cu, Cu alloys, Al, Al alloys, Ni, Au, and solder are employed. The photoresist cleaning composition of the invention is specifically effective for preventing corrosion of a substrate using Cu or solder as the conductive metal.

In the bump formation process, the photoresist pattern is thickly formed, and therefore, it is inevitable that the pattern is liable to cause deformation in its shape, such as collapse and deformation, as compared with the case of a thin film pattern formed. If deformation or collapse are caused in the formation of the photoresist patterns prior to the completion of the bump formation, it is necessary to remove away such deformed photoresist patterns from the substrate and again apply the substrate for the bump formation from the beginning ("re-work").

The photoresist cleaning composition of the invention is specifically effective in removing the photoresist pattern after the bump has been formed, or in removing a deformed photoresist pattern for the re-work process.

That is, the photoresist cleaning composition of the invention is brought into contact with a photoresist pattern after the bump formation or a deformed photoresist pattern for a re-work process where a bump has not yet been formed, thereby to remove those patterns.

In contacting the photoresist cleaning composition with the photo-cured patterns, it is preferable to immerse the substrate entirely in a photoresist cleaning composition tank. By contacting the substrate with the photoresist cleaning composition, the photo-cured pattern is stripped away from the substrate while being partly dissolved, and further in the present invention, it exhibits good cleaning such that the thus stripped-away cured pattern is rapidly dissolved. Even if the cured pattern is stripped away from the substrate, if the stripped cured pattern remains in the photoresist cleaning composition tank without being rapidly dissolved, then there is the fear of the re-adhesion of the stripped-away photo-cured pattern or its residue to the substrate or to a subsequent substrate processed in the cleaning tank.

The photoresist cleaning composition of the invention allows the photo-cured pattern to be stripped away completely from the substrate and to be dissolved even when the pattern is made of a negative-working photopolymerizable photoresist, which has hitherto been considered to be difficult for complete removal or to take a long period of time for removal, and even more difficult to remove when the pattern is thick (e.g., 3-150 μm). The invention exhibits effects such as rapid stripping from a substrate. Also, the invention is able to effectively prevent corrosion of the metallic thin film and bumps (conductive layer) on the substrate. Further, the present invention can prevent a formation of a degenerated film at the interface between the bump and the photoresist pattern.

The immersion time of the substrate may be a time sufficient for stripping of the photoresist pattern from the substrate and is not particularly limited, but is usually from about 10 seconds to 20 minutes. The processing temperature is preferably about 25-90° C., and particularly about 40-80° C. In the photoresist cleaning composition of the invention, cured materials may be completely dissolved within a time of about 5-60 minutes.

Additionally, in the method of this invention, prior to contacting the substrate having the photo-cured pattern thereon with the photoresist cleaning composition of the invention, the substrate may be contacted with an aqueous solution of ozone and/or an aqueous solution of hydrogen peroxide. Further, in the methods of this invention, the substrate having the photo-cured pattern thereon may be contacted in a cyclical manner with (1) aqueous ozone or hydrogen peroxide solution, (2) one or more of the photoresist cleaning compositions described herein, (3) rinsed with DIW, and (4) steps 1-3 repeated from 1 to 10 times. Alternatively, only steps 2 and 3 may be repeated 1 to 10 times without contacting the substrate with aqueous ozone or hydrogen peroxide solution. This cyclical process is repeated as many times from 1 to 10 to achieve complete cleaning of the substrate.

EXAMPLES

The invention will be hereunder described in detail with reference to the following Examples, but it should not be construed that the invention is limited thereto. All amounts throughout the application including in the examples below are in mass % unless otherwise indicated.

Preparation of Photoresist Cleaning Composition

Photoresist cleaning compositions as shown in the tables below were prepared by combining the amounts of the individual components in a glass beaker on a stir plate at room temperature.

The abbreviations in the tables for the respective components have the following meanings:
4BHA: 4-hydroxybenzoic acid
DIW: de-ionized water
DMSO: dimethyl sulfoxide
PG: propylene glycol
PEI: polyethyleneimine
TBC: tertiary butyl catechol
TMAH: tetramethylammonium hydroxide The pH of the compositions were determined by measuring the compositions at room temperature using a pH meter after diluting the composition to 5 mass % in deionized water (DIW).

The corrosion (etch) rates of Aluminum and Copper and the passivation materials were tested by using blanket wafers of the metal or passivation materials. The tests were setup to last 20 minutes if the etch rates were above about 20-30 angstroms/minute (Å/min), or for 60 minutes if the etch rates were less than about 20 Å/min. Thickness measurements in Å were made in triplicate after times 0, 3, 5, 10, and 20 minutes, or 0, 10, 20, 40, and 60 minutes. The numeric average of the etch rates are reported herein. Metal thickness measurements were made using a ResMap Four Point probe. Film thickness measurements for passivation materials used a Filmtek ellipsometer.

The cleaning tests were conducted as follows. Test wafers having previously cured and developed photoresist, and microbumps already formed thereon were obtained from Fraunhofer IZM, Germany. Some of the wafers had bump diameters of 50 μm, others had bump diameters of 25 μm. The wafers having bump diameters of 50 μm had bump pitches of 110, 150, 300 and 600 μm on each wafer. The wafers having bump diameters of 25 μm had bump pitches of 55, 75, 150 and 300 μm on each wafer. The wafers had two types of metal stacks to form the bumps: (a) Cu and SnAg and (b) Cu, Ni, and SnAg. The substrate for all of the wafers had a coating of 50 nm Ti and 300 nm Cu. The photoresist was AZ IPS-528, 50 μm thickness. Each 2"×2" piece of the substrate was immersed for 2-10 minutes into 330 ml of the Example cleaning solutions in a 500 ml glass beaker while the solution was stirred on a stir plate at 300 rpm. The solution was heated and the temperature was recorded. The temperatures were ~40-65° C. After immersion the substrates were rinsed with DI water for 3 minutes at ambient and dried with Nitrogen. The treated substrates were photographed using an SEM and the photographs were visually inspected and rated using the following ratings:
✓✓✓✓=completely cleaned
✓✓✓=means slight residues
✓✓=means partial cleaning
✓=means little to no cleaning

|  | Example Nos. | | | | | |
| --- | --- | --- | --- | --- | --- | --- |
|  | 37A | 37B | 37C | 37D | 37E | 37F |
| Total Grams | 100.00 | 100.00 | 100.00 | 100.00 | 100.00 | 100.00 |
| DMSO | 92.00 | 92.00 | 92.00 | 92.00 | 92.00 | 92.00 |
| PG | 2.00 | 2.00 | 2.00 | 2.00 | 2.00 | 2.00 |
| Catechol | 1.00 | — | — | — | — | — |
| TBC | — | 1.00 | — | — | — | — |
| Ammonium benzoate | — | — | 1.00 | — | — | — |
| Anthranilic acid | — | — | — | 1.00 | — | — |
| Benzoic acid | — | — | — | — | 1.00 | — |
| Salicylic acid | — | — | — | — | — | 1.00 |
| TMAH | 1.25 | 1.25 | 1.25 | 1.25 | 1.25 | 1.25 |
| water | 3.75 | 3.75 | 3.75 | 3.75 | 3.75 | 3.75 |
| cleaning | — | — | — | — | — | — |

|  | Example Nos. | | | | | |
| --- | --- | --- | --- | --- | --- | --- |
|  | 38A | 38B | 38C | 38D | 38E | 38F |
| Total Grams | 100.00 | 100.00 | 102.00 | 100.00 | 100.00 | 100.00 |
| DMSO | 92.00 | 92.00 | 92.00 | 92.00 | 92.00 | 93.00 |
| PG | 2.00 | 2.00 | 2.00 | 2.00 | 2.00 | 2.00 |
| 2,4-dihydroxybenzoic acid | 1.00 | — | — | — | — | — |
| 3,4-dihydroxybenzoic acid | — | 1.00 | — | — | — | — |
| 3,5-dihydroxybenzoic acid | — | — | 1.00 | — | — | — |
| 4-hydroxybenzoic acid | — | — | 1.00 | 1.00 | — | — |
| Citric Acid | — | — | 1.00 | — | 1.00 | — |
| PEI (MW 600) | — | — | — | — | — | — |
| TMAH | 1.25 | 1.25 | 1.25 | 1.25 | 1.25 | 1.25 |
| water | 3.75 | 3.75 | 3.75 | 3.75 | 3.75 | 3.75 |
| pH | — | — | — | 9.58 | 6.37 | 11.01 |
| cleaning | — | — | — | — | — | — |

-continued

|  | Example Nos. | | | | | | | | |
| --- | --- | --- | --- | --- | --- | --- | --- | --- | --- |
|  | 38Q | 38R | 38S | 38T | 38U | 38V | 38W | 38X | 38Y |
| Total Grams | 100.00 | 100.00 | 100.00 | 100.00 | 100.00 | 100.00 | 100.00 | 100.00 | 100.00 |
| DMSO | 91.00 | 90.00 | 88.00 | 89.00 | 88.00 | 87.00 | 87.50 | 90.00 | 89.00 |
| PG | 2.00 | 2.00 | 2.00 | 2.00 | 2.00 | 2.00 | 2.00 | 2.00 | 2.00 |
| 2,4-dihydroxybenzoic acid | — | — | — | — | — | — | — | — | — |
| 3,4-dihydroxybenzoic acid | — | — | — | — | — | — | — | — | — |
| 3,5-dihydroxybenzoic acid | — | — | — | — | — | — | — | — | — |
| 4-hydroxybenzoic acid | 1.00 | 1.00 | 1.00 | 2.00 | 3.00 | 2.00 | 1.50 | 1.00 | 1.00 |
| Citric Acid | — | — | — | — | — | — | — | — | — |
| PEI (MW 600) | — | — | — | — | — | — | — | 1.00 | 2.00 |
| TMAH | 1.50 | 1.75 | 2.25 | 1.75 | 1.75 | 2.25 | 2.25 | 1.50 | 1.50 |
| water | 4.50 | 5.25 | 6.75 | 5.25 | 5.25 | 6.75 | 6.75 | 4.50 | 4.50 |
| pH | 10.78 | 11.09 | 11.37 | 8.94 | 5.45 | 9.57 | 11.07 | 10.96 | 11.03 |
| cleaning | — | — | — | — | — | — | — | — | — |

|  | Example Nos. | | |
| --- | --- | --- | --- |
|  | 39A | 39B | 39C |
| Total Grams | 100.00 | 100.00 | 100.00 |
| DMSO | 89.00 | 89.00 | 89.00 |
| PG | 2.00 | 2.00 | 2.00 |
| Benzoic acid | — | — | — |
| 4-Hydroxybenzoic acid | — | — | — |
| Citric Acid | 1.00 | 1.00 | 1.00 |
| PEI (MW 600) | 2.00 | — | — |
| PEI (MW 1200) | — | 2.00 | — |
| PEI (MW 15000) | — | — | 2.00 |
| TMAH | 4.50 | 4.50 | 4.50 |
| water | 1.50 | 1.50 | 1.50 |
| pH | 10.65 | 10.54 | 10.65 |
| cleaning | — | — | — |

|  | Example Nos. | | | | | |
| --- | --- | --- | --- | --- | --- | --- |
|  | 42A | 42B | 42C | 42D | 42E | 42F |
| Total Grams | 100.00 | 100.00 | 100.00 | 100.00 | 100.00 | 100.00 |
| DMSO | 89.50 | 89.50 | 91.75 | 91.50 | 91.00 | 90.50 |
| PG | 2.00 | 2.00 | 2.00 | 2.00 | 2.00 | 2.00 |
| TBC | 1.00 | 1.00 | 1.00 | 1.00 | 1.50 | 2.00 |
| PEI (MW 600) | 2.00 | — | — | — | — | — |
| PEI (MW 15000) | — | 2.00 | — | — | — | — |
| TMAH | 4.125 | 4.125 | 1.31 | 4.125 | 4.125 | 4.125 |
| water | 1.375 | 1.375 | 3.94 | 1.375 | 1.375 | 1.375 |
| pH | 11.42 | 11.31 | 11.21 | 11.51 | 10.39 | 10.00 |
| cleaning | — | — | — | — | — | — |

|  | Example Nos. | | | | | | |
| --- | --- | --- | --- | --- | --- | --- | --- |
|  | 47A | 47B | 47C | 47D | 47E | 47F | 48A |
| Total Grams | 100.00 | 100.00 | 100.00 | 100.00 | 100.00 | 100.00 | 100.00 |
| DMSO | 90.00 | 89.00 | 91.50 | 89.08 | 88.08 | 90.63 | 91.86 |
| PG | 2.00 | 2.00 | 2.00 | 2.00 | 2.00 | 2.00 | 2.00 |
| DIW | 4.50 | 4.50 | 4.12 | 4.50 | 4.50 | 4.14 | 3.34 |
| TBC | — | — | 1.00 | — | — | 1.00 | 1.00 |
| 4-Hydroxybenzoic acid | 1.00 | — | — | 1.00 | — | — | — |
| Citric Acid | — | 1.00 | — | — | 1.00 | — | — |
| PEI (MW 600) | 1.00 | — | — | 1.00 | — | — | — |
| PEI (MW 1200) | — | 2.00 | — | — | 2.00 | — | — |

-continued

| | | | | | | | |
|---|---|---|---|---|---|---|---|
| TEAH | 1.50 | 1.50 | 1.38 | 2.42 | 2.42 | 2.23 | 1.80 |
| pH | 9.74 | 9.78 | 10.68 | 10.85 | 6.61 | 11.31 | 11.53 |
| Cleaning | — | — | — | ✓✓ | ✓ | ✓✓✓ | ✓✓✓✓ |

| Example No. | Comparative Example 1 |
|---|---|
| Total Grams | 100.00 |
| DMSO | 95.0 |
| TMAH | 1.25 |
| water | 4.75 |
| pH | 11.53 |

| Corrosion Inhibitor | Example Tested | pH | Al E/R | Cu E/R |
|---|---|---|---|---|
| None | Comparative Ex 1 | 11.53 | 313 | 234 |
| Catechol | 37A | 9.44 | 8 | 18 |
| TBC | 37B | 10.39 | 15 | 10 |
| Ammonium Benzoate | 37C | 10.66 | 14 | 36 |
| Anthranilic Acid | 37D | 10.69 | 10 | 39 |
| Benzoic Acid | 37E | 10.61 | 9 | 31 |
| Salicylic Acid | 37F | 10.69 | 153 | 44 |
| 2,4-dihydroxybenzoic acid | 38A | 9.92 | 2.2 | 5.9 |
| 3,4-dihydroxybenzoic acid | 38B | 9.74 | 4.1 | 7.5 |
| 3,5-dihydroxybenzoic acid | 38C | 9.89 | 28 | 3.1 |
| 4-hydroxybenzoic acid | 38D | 9.58 | 0 | 5 |
| Citric Acid | 38E | 6.37 | 1 | 3.9 |
| None | 38F | 11.01 | 147 | 159 |

| | Weight % (Balance DMSO) | | | PEI/C.I. | Al | Cu | | PEI |
|---|---|---|---|---|---|---|---|---|
| Ex. No. | TMAH* | PG | C.I. | Ratio | ER | ER | pH | MW |
| Comp. Ex. | 5 | 0 | 0 | 0 | 313 | 234 | 10.98 | N/A |
| 38F | 5 | 2 | 0 | 0 | 147 | 159 | 11.01 | N/A |
| C.I. = 4HBA | | | | | | | | |
| 38Q | 6 | 2 | 1 | 0 | 37 | 24 | 10.78 | N/A |
| 38X | 6 | 2 | 1 | 1 | 39 | 5 | 10.96 | 600 |
| 38Y | 6 | 2 | 1 | 2 | 33 | 6 | 11.03 | 600 |
| 38R | 7 | 2 | 1 | 0 | 120 | 43 | 11.09 | N/A |
| C.I. = Citric Acid | | | | | | | | |
| 39A | 6 | 2 | 1 | 2 | <6 | 20 | 10.65 | 600 |
| 39B | 6 | 2 | 1 | 2 | <18 | 11 | 10.54 | 1200 |
| 39C | 6 | 2 | 1 | 2 | 1 | 3 | 10.65 | 15000 |
| C.I. = TBC | | | | | | | | |
| 37B | 5 | 2 | 1 | 0 | 15 | 10 | 10.39 | N/A |
| 42A | 5.5 | 2 | 1 | 2 | 164 | 41 | 11.42 | 600 |
| 42B | 5.5 | 2 | 1 | 2 | 144 | 4 | 11.31 | 15000 |
| 42C | 5.25 | 2 | 1 | 0 | 126 | 51 | 11.21 | N/A |
| 42D | 5.5 | 2 | 1 | 0 | 67 | 22 | 11.51 | N/A |
| 42E | 5.5 | 2 | 1.5 | 0 | 27 | 5 | 10.39 | N/A |
| 42F | 5.5 | 2 | 2 | 0 | <1 | 17 | 10.00 | N/A |

*TMAH is 25 mass % aqueous solution

| | | | | | | | |
|---|---|---|---|---|---|---|---|
| C.I. = 4HBA | | | | | | | |
| 47D | 2.42 | 1 | 1 | 14 | 9 | 10.85 | 600 | ✓✓ |
| C.I. = Citric acid | | | | | | | |
| 47E | 2.42 | 1 | 2 | 66 | 8 | 10.51 | 1200 | ✓ |
| C.I. = TBC | | | | | | | |
| 47F | 2.23 | 1 | 0 | 24 | 30 | 11.31 | N/A | ✓✓✓ |
| 48A | 1.8 | 1 | 0 | 4.5 | 17 | 11.53 | N/A | ✓✓✓✓ |

| | | Metals-Etch Rates in Å/min | |
|---|---|---|---|
| Example No. | Temp (° C.) | Al* | Cu |
| Comparative Example 1 | 40 | 124 | 44 |
| | 65 | 313 | 234* |
| 48A | 40 | <2 | <1 |
| | 65 | 5 | 17 |
| 50L | 40 | 8 | 5 |
| | 65 | 39 | 10 |
| 50M | 40 | 13 | 7 |
| | 65 | 83 | 9 |
| 50N | 40 | 12 | 11 |
| | 65 | 19 | 18 |

*Al(4% Cu)

| | Passivation Materials-Etch Rates in Å/min at 65° C. | | | |
|---|---|---|---|---|
| Example No. | PSG | TiNx | SiN | TEOS |
| Comparative Example 1 | <1 | <1 | <1 | <1 |
| 48A | <1 | <1 | <1 | <1 |
| 50L | <1 | <1 | N/A | 1 |
| 50N | <1 | <1 | N/A | <1 |

| | Example No. | | | | | |
|---|---|---|---|---|---|---|
| | 50A | 50B | Comp. Ex 2 | 50D | Comp. Ex 3 | Comp. Ex 4 |
| Grams needed | 100.00 | 100.00 | 100.00 | 100.00 | 100.00 | 100.00 |
| DPM | 50.00 | 50.00 | 50.00 | 0.00 | 0.00 | 93.86 |
| DMSO | 43.86 | 41.86 | 0.00 | 43.86 | 0.00 | 0.00 |
| PG | 0.00 | 2.00 | 43.86 | 50.00 | 93.86 | 0.00 |
| DIW | 3.34 | 3.34 | 3.34 | 3.34 | 3.34 | 3.34 |
| TBC | 1.00 | 1.00 | 1.00 | 1.00 | 1.00 | 1.00 |
| TEAH | 1.80 | 1.80 | 1.80 | 1.80 | 1.80 | 1.80 |
| pH | 10.76 | 10.98 | 11.27 | 11.24 | 11.43 | 10.95 |
| Etch Rates at 65° C.(Å/min) | | | | | | |
| Al | 10 | 4 | N/A | <10 | <1 | 18 |
| Cu (0-5 min) | 16 | 11.5 | 2.6 | 3 | 2.2 | ~4 |
| Cu (10-20 min) | 1.7 | 1.5 | 0.25 | 0.6 | <1 | <1 |
| Cleaning | almost ✓✓✓✓ | ✓✓✓ | ✓ | ✓✓✓ | ✓✓ | ✓ |

| | Example No. | | |
|---|---|---|---|
| | 50L | 50M | 50N |
| Grams needed | 100.00 | 100.00 | 100.00 |
| DPM | — | — | — |
| DMSO | 80.10 | 78.86 | 65.10 |

-continued

| | | | |
|---|---|---|---|
| PG | 2.00 | 2.00 | 2.00 |
| DIW | 5.10 | 5.91 | 5.10 |
| MEA | — | — | 15.00 |
| TBC | 1.00 | 1.00 | 1.00 |
| DEHA | 10.00 | 10.00 | 10.00 |
| TEAH | 1.80 | 2.23 | 1.80 |
| pH | 11.05 | 11.03 | 11.14 |
| Cleaning | ✓✓✓ | ✓✓✓ | ✓✓✓ |

As described above in detail, by using the photoresist cleaning composition of the invention, it is possible to not only to strip a thick photoresist pattern for the formation of a bump from a substrate but also to dissolve the stripped photoresist pattern in the photoresist cleaning composition without causing re-adhesion to the substrate. Also, it is possible to improve the production efficiency.

The invention claimed is:

1. A photoresist cleaning composition for stripping a photoresist pattern having a film thickness of 3-150 μm, which comprises (a) 0.5-5 mass % of at least one quaternary ammonium hydroxide or mixtures of two or more quaternary ammonium hydroxides; (b) 60-97.5 mass % of a mixture of water-soluble organic solvent comprising dimethylsulfoxide (DMSO), sulfolane or dimethylsulfone or mixtures thereof, and at least one additional organic solvent or two or more additional organic solvents; (c) 0.5-15 mass % of two or more corrosion inhibitors comprising PEI and at least one corrosion inhibitor or a mixture of two or more corrosion inhibitors selected from the group consisting of catechol, tert-butyl catechol, ammonium benzoate, benzoic acid, salicylic acid, citric acid, gallic acid, mono or dihydroxybenzoic acid, diethylhydroxylamine (DEHA), hydroxylamine or dipropylhydroxylamine or salts thereof or mixtures thereof; and (d) 0.5-25 mass % of water.

2. The photoresist cleaning composition of claim 1, wherein said (b) comprises 80-96 mass % of said dimethylsulfoxide (DMSO), sulfolane or dimethylsulfone or mixtures thereof, and 1-4 mass % of said at least one additional organic solvent or two or more additional organic solvents; and said (c) compises 1-5 mass %; and said (d) comprises 1-10 mass %.

3. The photoresist cleaning composition of claim 1, wherein said (b) comprises 80-96 mass % dimethylsulfoxide (DMSO), sulfolane or dimethylsulfone or mixtures thereof, and 1-4 mass % of at least one additional organic solvent or two or more additional organic solvents; wherein said (c) is 1-10 mass %; and said (d) is 1-10 mass %.

4. The photoresist cleaning composition of claim 1, wherein said (b) comprises 35-50 mass % dimethylsulfoxide (DMSO), sulfolane or dimethylsulfone or mixtures thereof and 45-58 mass % of additional organic solvent or two or more additional organic solvents; said (c) is 1-10 mass %; and said (d) is 1-10 mass %.

5. The photoresist cleaning composition of claim 1, wherein said (a) is 1-5 mass %; said (b) is 78-85 mass %; said (c) is 10.5-15 mass %; and said (d) is 1-10 mass %.

6. The photoresist cleaning composition of claim 1, wherein said (a) is 1-5 mass %; said (b) is 59-84 mass % dimethylsulfoxide (DMSO), sulfolane or dimethylsulfone or mixtures thereof and 1-20 mass % of at least one additional organic solvent or two or more additional organic solvents; said (c) is 10.5-15 mass %; and said (d) is 1-10 mass %.

7. The photoresist cleaning composition of claim 1, wherein said at least one corrosion inhibitor is selected from the group consisting of catechol, tert-butyl catechol, ammonium benzoate, benzoic acid, salicylic acid, citric acid, gallic acid, mono or dihydroxybenzoic acid, polyethyleneimine (PEI), diethylhydroxylamine (DEHA), hydroxylamine or dipropylhydroxylamine or salts thereof or mixtures thereof or mixtures of any of the corrosion inhibitors.

8. The photoresist cleaning composition of claim 1, which comprises (b) 82-97.5 mass % of said mixture of water-soluble organic solvent; (c) 1-5 mass % of said corrosion inhibitors; and (d) 1-10 mass % of said water.

9. The photoresist cleaning composition of claim 8, wherein said at least one additional organic solvent is selected from the group consisting of propylene glycol, tetrahydrofurfuryl alcohol, a glycol ether, gamma-butyrolactone, gamma-valerolactone, dimethylacetamide, monoethanolamine and aminopropylmorpholine and mixtures thereof.

10. A photoresist cleaning composition for stripping a photoresist pattern having a film thickness of 3-150 μm, which comprises (a) 1-5 mass % of at least one quaternary ammonium hydroxide or mixtures of two or more quaternary ammonium hydroxides; (b) 78-85 mass % of a mixture of water-soluble organic solvent comprising dimethylsulfoxide (DMSO), sulfolane or dimethylsulfone or mixtures thereof and at least one additional organic solvent or two or more additional organic solvents; (c) 10-20 mass % of diethylhydroxylamine (DEHA), hydroxylamine or dipropylhydroxylamine or salts thereof or mixtures thereof and 0.5-5 mass % of at least one additional corrosion inhibitor or mixtures of two or more additional corrosion inhibitors; and (d) 1-10 mass % of water.

11. A photoresist cleaning composition for stripping a photoresist pattern having a film thickness of 3-150 μm, which comprises (a) 1-5 mass % of at least one quaternary ammonium hydroxide or mixtures of two or more quaternary ammonium hydroxides; (b) 59-84 mass % dimethylsulfoxide (DMSO), sulfolane or dimethylsulfone or mixtures thereof and 1-20 mass % of at least one additional organic solvent or two or more additional organic solvents; (c) 10-20 mass % of diethylhydroxylamine (DEHA), hydroxylamine or dipropylhydroxylamine or salts thereof or mixtures thereof and 0.5-5 mass % of at least one additional corrosion inhibitor or mixtures of two or more additional corrosion inhibitors; and (d) is 1-10 mass % water.

12. The photoresist cleaning composition of claim 11, wherein said (b) is 64-69 mass % of a mixture of organic solvents comprising dimethylsulfoxide (DMSO), sulfolane or dimethylsulfone or mixtures thereof, and at least one additional organic solvent or two or more additional organic solvents comprising alkanolamine.

13. The photoresist cleaning composition of claim 11, wherein said (b) comprises dimethylsulfoxide and said at least one additional organic solvent is selected from the group consisting of propylene glycol, tetrahydrofurfuryl alcohol, a glycol ether, gamma-butyrolactone, gamma-valerolactone, dimethylacetamide, monoethanolamine and aminopropylmorpholine and mixtures thereof.

14. The photoresist cleaning composition of claim 11, wherein said (a) comprises 1-3 mass % of a quaternary ammonium hydroxide selected from the group consisting of tetramethylammonium hydroxide or tetraethylammonium hydroxide, and mixtures thereof; said (b) is dimethylsulfoxide and said at least one additional organic solvent is selected from the group consisting of propylene glycol, tetrahydrofurfuryl alcohol, glycol ether, gamma-butyrolactone, gamma-valerolactone, dimethylacetamide, monoethanolamine and aminopropylmorpholine and mixtures thereof; and said (c) comprises at least one corrosion inhibitor selected from the group consisting of catechol, tert-butyl catechol, ammonium benzoate, benzoic acid, salicylic acid, citric acid, gallic acid, mono or dihydroxybenzoic acid, polyethyleneimine (PEI) or mixtures thereof; and said (d) is 2-5 mass %.

15. The photoresist cleaning composition of claim 14, wherein said (b) comprises dimethylsulfoxide and 1-6 mass % of said at least one additional organic solvent selected from the group consisting of propylene glycol, tetrahydrofurfuryl alcohol, dipropyleneglycol methylether, gamma-butyrolactone, gamma-valerolactone, dimethylacetamide, monoethanolamine and aminopropylmorpholine or mixtures thereof; and said (c) is 0.5-3 mass %.

16. A method for treating a substrate, comprising forming a photoresist pattern having a film thickness of 3-150 μm on a substrate having a metallic thin film thereon, providing a conductive layer on a metallic thin film-exposed area or a photoresist pattern uncovered area, and bringing the photoresist pattern into contact with the photoresist cleaning composition comprising (a) 0.5-5 mass % of at least one quaternary ammonium hydroxide or mixtures of two or more quaternary ammonium hydroxides; (b) 60-97.5 mass % of a mixture of water-soluble organic solvent comprising dimethylsulfoxide (DMSO), sulfolane or dimethylsulfone or mixtures thereof, and at least one additional organic solvent or two or more additional organic solvents; (c) 0.5-15 mass % of at least one corrosion inhibitor or a mixture of two or more corrosion inhibitors selected from the group consisting of catechol, tert-butyl catechol, ammonium benzoate, benzoic acid, salicylic acid, citric acid, gallic acid, mono or dihydroxybenzoic acid, polyethyleneimine (PEI), diethylhydroxylamine (DEHA), hydroxylamine or dipropylhydroxylamine or salts thereof or mixtures thereof; and (d) 0.5-25 mass % of water to strip and dissolve the photoresist pattern.

17. The method for treating a substrate according to claim 16, wherein the said (b) is 82-97.5 mass %; said (c) is 1-5 mass %; and said (d) is 1-10 mass %.

18. The method for treating a substrate according to claim 17, wherein said (c) comprises a mixture of two or more corrosion inhibitors comprising PEI.

19. The method for treating a substrate according to claim 16, wherein said (b) comprises 35-50 mass % dimethylsulfoxide (DMSO), sulfolane or dimethylsulfone or mixtures thereof and 45-58 mass % of additional organic solvent or two or more additional organic solvents; said (c) is 1-10 mass %; and said (d) is 1-10 mass %.

20. The method for treating a substrate according to claim 19, wherein (c) further comprises 10-20 mass % of diethylhydroxylamine (DEHA), hydroxylamine or dipropylhydroxylamine or salts thereof or mixtures thereof.

* * * * *